(12) United States Patent
Watanabe et al.

(10) Patent No.: US 9,825,077 B2
(45) Date of Patent: Nov. 21, 2017

(54) PHOTOELECTRIC CONVERSION DEVICE, METHOD FOR PRODUCING PHOTOELECTRIC CONVERSION DEVICE, AND IMAGE PICKUP SYSTEM

(71) Applicant: Canon Kabushiki Kaisha, Tokyo (JP)

(72) Inventors: Takanori Watanabe, Yamato (JP); Tetsuya Itano, Zama (JP); Hidekazu Takahashi, Zama (JP); Shunsuke Takimoto, Machida (JP); Kotaro Abukawa, Hiratsuka (JP); Hiroaki Naruse, Yokohama (JP); Shigeru Nishimura, Ebina (JP); Masatsugu Itahashi, Atsughi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 14/805,561

(22) Filed: Jul. 22, 2015

(65) Prior Publication Data

US 2015/0325610 A1    Nov. 12, 2015

Related U.S. Application Data

(60) Continuation of application No. 12/881,582, filed on Sep. 14, 2010, now abandoned, which is a division of
(Continued)

(30) Foreign Application Priority Data

Aug. 2, 2006  (JP) .................................. 2006-210531

(51) Int. Cl.
*H01L 21/00* (2006.01)
*H01L 27/146* (2006.01)

(52) U.S. Cl.
CPC .. *H01L 27/14616* (2013.01); *H01L 27/14609* (2013.01); *H01L 27/14612* (2013.01); *H01L 27/14689* (2013.01)

(58) Field of Classification Search
CPC ............... Y01E 10/50; H01L 27/14689; H01L 27/14616; H01L 27/14609
(Continued)

(56) References Cited

U.S. PATENT DOCUMENTS 5,523,609 A    6/1996   Fukusho
6,144,071 A    11/2000  Gardner et al.
(Continued)

FOREIGN PATENT DOCUMENTS

EP    1075028 A2    2/2001
EP    1394858 A2    3/2004
(Continued)

*Primary Examiner* — Lex Malsawma
*Assistant Examiner* — Eric Jones
(74) *Attorney, Agent, or Firm* — Fitzpatrick, Cella, Harper & Scinto

(57) ABSTRACT

A photoelectric conversion device includes a photoelectric conversion region having a plurality of photoelectric conversion elements and a first MOS transistor configured to read a signal in response to an electric charge of each photoelectric conversion element; and a peripheral circuit region having a second MOS transistor configured to drive the first MOS transistor and/or amplify the signal read from the photoelectric conversion region, the photoelectric conversion region and the peripheral circuit region being located on the same semiconductor substrate, wherein an impurity concentration in a drain of the first MOS transistor is lower than an impurity concentration in a drain of the second MOS transistor.

15 Claims, 10 Drawing Sheets

Related U.S. Application Data application No. 11/774,270, filed on Jul. 6, 2007, now Pat. No. 7,920,192.

(58) Field of Classification Search
USPC .................................. 438/73, 48, 57, 66, 75
See application file for complete search history.

(56) References Cited

U.S. PATENT DOCUMENTS

| | | | |
|---|---|---|---|
| 6,166,405 A | 12/2000 | Kuriyama et al. | |
| 6,169,317 B1 | 1/2001 | Sawada et al. | |
| 6,180,532 B1 | 1/2001 | Yang et al. | |
| 6,437,311 B2 | 8/2002 | Tsang | |
| 6,570,222 B2 | 5/2003 | Nozaki et al. | |
| 6,630,721 B1 | 10/2003 | Ligon | |
| 6,731,337 B2 | 5/2004 | Watanabe | |
| 6,767,759 B2 * | 7/2004 | Rhodes | H01L 27/14601 257/E27.133 |
| 6,838,305 B2 | 1/2005 | Moriyama et al. | |
| 6,908,839 B2 | 6/2005 | Rhodes | |
| 6,973,265 B2 | 12/2005 | Takahashi | |
| 6,974,715 B2 * | 12/2005 | Lee | H01L 27/14689 257/E27.132 |
| 7,119,387 B2 | 10/2006 | Ohkawa | |
| 7,126,102 B2 | 10/2006 | Inoue et al. | |
| 7,183,129 B2 * | 2/2007 | Lee | H01L 27/14689 257/E27.132 |
| 7,242,043 B2 | 7/2007 | Ohkawa | |
| 7,259,361 B2 | 8/2007 | Nishimura | |
| 7,402,451 B2 * | 7/2008 | Rhodes | H01L 27/14603 257/E27.131 |
| 7,411,170 B2 | 8/2008 | Shimotsusa et al. | |
| 7,462,810 B2 | 12/2008 | Kobayashi et al. | |
| 7,671,912 B2 | 3/2010 | Abe et al. | |
| 7,749,788 B2 | 7/2010 | Okagawa et al. | |
| 7,817,199 B2 | 10/2010 | Yamashita et al. | |
| 7,825,974 B2 | 11/2010 | Itano et al. | |
| 7,829,921 B2 | 11/2010 | Rhodes | |
| 8,482,643 B2 | 7/2013 | Abe et al. | |
| 8,994,863 B2 | 3/2015 | Abe et al. | |
| 2002/0000423 A1 * | 1/2002 | Becker | H01L 21/31116 216/67 |
| 2003/0234432 A1 | 12/2003 | Song et al. | |
| 2004/0046193 A1 | 3/2004 | Park et al. | |
| 2004/0080009 A1 | 4/2004 | Sandhu et al. | |
| 2004/0147068 A1 | 7/2004 | Toyoda et al. | |
| 2004/0169127 A1 * | 9/2004 | Ohkawa | H01L 27/14603 250/214.1 |
| 2004/0242019 A1 | 12/2004 | Klein et al. | |
| 2004/0253811 A1 | 12/2004 | Lee et al. | |
| 2005/0006712 A1 | 1/2005 | Ngo et al. | |
| 2005/0067640 A1 * | 3/2005 | Ohkawa | H01L 27/14601 257/291 |
| 2005/0151175 A1 * | 7/2005 | Ohkawa | H01L 27/14601 257/292 |
| 2005/0153469 A1 | 7/2005 | Ochi | |
| 2005/0237405 A1 * | 10/2005 | Ohkawa | H01L 27/14641 348/308 |
| 2005/0277239 A1 | 12/2005 | Han | |
| 2006/0011952 A1 | 1/2006 | Ohkawa | |
| 2006/0043393 A1 | 3/2006 | Okita et al. | |
| 2006/0044434 A1 | 3/2006 | Okita et al. | |
| 2006/0061674 A1 | 3/2006 | Iida et al. | |
| 2006/0208161 A1 | 9/2006 | Okita et al. | |
| 2006/0208291 A1 | 9/2006 | Koizumi et al. | |
| 2006/0208292 A1 | 9/2006 | Itano et al. | |
| 2006/0221667 A1 | 10/2006 | Ogura et al. | |
| 2006/0238633 A1 | 10/2006 | Kinugasa et al. | |
| 2006/0290659 A1 * | 12/2006 | Sakano | H01L 27/14689 345/156 |
| 2007/0020796 A1 * | 1/2007 | Park | H01L 27/14609 438/57 |
| 2007/0102738 A1 * | 5/2007 | Adkisson | H01L 27/14623 257/292 |
| 2007/0108546 A1 | 5/2007 | Furuichi | |
| 2007/0115377 A1 | 5/2007 | Noda et al. | |
| 2007/0252184 A1 | 11/2007 | Ohkawa | |
| 2008/0029787 A1 | 2/2008 | Watanabe et al. | |
| 2008/0030612 A1 | 2/2008 | Itano et al. | |
| 2008/0054388 A1 | 3/2008 | Nakata et al. | |
| 2010/0110243 A1 | 5/2010 | Abe et al. | |
| 2010/0110244 A1 | 5/2010 | Abe et al. | |
| 2013/0265471 A1 | 10/2013 | Abe et al. | |

FOREIGN PATENT DOCUMENTS

| | | |
|---|---|---|
| JP | 6275727 A | 9/1994 |
| JP | 07-078956 A | 3/1995 |
| JP | 10-200085 A | 7/1998 |
| JP | H11-284167 A | 10/1999 |
| JP | 2000-012822 A | 1/2000 |
| JP | 2002-325204 A | 11/2002 |
| JP | 2004-172950 A | 6/2004 |
| JP | 2005-101442 A | 4/2005 |
| JP | 2006-032672 A | 2/2006 |
| JP | 2006-049921 A | 2/2006 |

* cited by examiner

PHOTOELECTRIC CONVERSION DEVICE, METHOD FOR PRODUCING PHOTOELECTRIC CONVERSION DEVICE, AND IMAGE PICKUP SYSTEM

This application is a continuation of application Ser. No. 12/881,582, filed Sep. 14, 2010, which is a division of application Ser. No. 11/774,270, which has been issued as U.S. Pat. No. 7,920,192.

BACKGROUND OF THE INVENTION

Field of the Invention

The present invention relates to a photoelectric conversion device. In particular, the present invention relates to a MOS photoelectric conversion device including a MOS transistor.

Description of the Related Art

In recent years, demands for photoelectric conversion devices as image pickup devices for use in two-dimensional image input apparatuses, such as digital still cameras and camcorders, and for use in one-dimensional image readers, such as facsimiles and scanners, have been rapidly increasing.

Charge-coupled devices (CCDs) and MOS photoelectric conversion devices are used as photoelectric conversion devices.

In photoelectric conversion devices, it is necessary to reduce noise generated in photoelectric conversion regions. An example of such noise is noise caused by hot carriers generated in MOS transistors disposed in photoelectric conversion regions. The term "hot carrier" refers to a carrier generated by subjecting a p-n junction constituted by a drain region and a channel end to a strong electric field generated by applying a voltage to a gate of a MOS transistor. In devices such as photoelectric conversion devices that handle weak signals, noise generated by hot carriers, in particular, may lead to a problem.

As an example of a method for reducing noise, Japanese Patent Laid-Open No. 11-284167 (Patent Document 1) and Japanese Patent Laid-Open No. 2000-012822 (Patent Document 2) each disclose a MOS transistor that has a lightly doped drain (LDD) structure and that is disposed in a photoelectric conversion region. This structure reduces the strength of an electric field applied to a drain and a channel formed below a gate and thus can reduce the effect of hot carriers.

In addition, Patent Document 2 discloses a process for producing a structure including a MOS transistor that has the LDD structure and that is disposed in a photoelectric conversion region. The process will be briefly described with reference to FIG. 2 of Patent Document 2. A light-receiving portion and a detecting portion described below serve as a source and a drain, respectively, of a transfer transistor.

A region to be formed into a light-receiving portion is subjected to ion implantation. To form a lightly doped semiconductor region in a detecting portion, ion implantation is performed. A silicon nitride film functioning as an anti-reflection film for the light-receiving portion is formed so as to cover the light-receiving portion, a gate electrode, and the detecting portion. The silicon nitride film is patterned on the gate electrode to form a side wall on the drain side of the gate electrode. A heavily doped semiconductor region is formed with the side wall as a mask to form a photoelectric conversion device.

In recent years, photoelectric conversion devices have been required to have higher pixel densities and larger numbers of pixels while photoelectric conversion properties, such as sensitivity and a dynamic range, have been maintained or improved. Reducing the driving voltage of a photoelectric conversion region and miniaturizing a region other than the photo-receiving portion while a reduction in the area of the photo-receiving portion is inhibited are effective in fabricating such photoelectric conversion devices.

However, the miniaturization of the MOS transistor for reading a signal in response to a signal charge of a photoelectric conversion element disposed in the photoelectric conversion region may degrade the reliability of transistor properties.

In the above-described process, the width of a side spacer is equal to that of a peripheral circuit region. Thus, when an electric field-reducing structure optimized for the peripheral circuit region is designed, a reduction in the electric field strength in the photoelectric conversion region may be insufficient. In this case, hot carriers degrade the reliability of the MOS transistor. Thus, to ensure reliability, the MOS transistor needs to have a larger gate length. This results in a disadvantage to miniaturization.

Furthermore, in the above-described process, the anti-reflection film in the photoelectric conversion region is subjected to etching. Etching causes damage (mainly plasma damage) to the photoelectric conversion region. This increases a dark current flowing through a photodiode.

To overcome at least one of the foregoing problems, the present invention provides a photoelectric conversion device having improved properties without an increase in the number of production steps.

SUMMARY OF THE INVENTION

In consideration of the above-described problems, a photoelectric conversion device according to the present invention includes a photoelectric conversion region having a plurality of photoelectric conversion elements and a first MOS transistor configured to read a signal in response to an electric charge of each photoelectric conversion element; and a peripheral circuit region having a second MOS transistor configured to drive the first MOS transistor and/or amplify the signal read from the photoelectric conversion region, the photoelectric conversion region and the peripheral circuit region being located on the same semiconductor substrate, wherein an impurity concentration in a drain of the first MOS transistor is lower than an impurity concentration in a drain of the second MOS transistor.

Further features of the present invention will become apparent from the following description of exemplary embodiments with reference to the attached drawings.

DESCRIPTION OF THE EMBODIMENTS

The structure according to the present invention will be described. In the present invention, a "photoelectric conversion region" refers to a region including a plurality of photoelectric conversion elements and a MOS transistor configured to read a signal in response to a charge of each photoelectric conversion element. A plurality of MOS transistors per photoelectric conversion element may be formed so as to amplify a signal.

A "peripheral circuit region" refers to a region including a circuit configured to drive the MOS transistor disposed in the photoelectric conversion region and a circuit configured to amplify a signal fed from the photoelectric conversion region.

Figure 1:
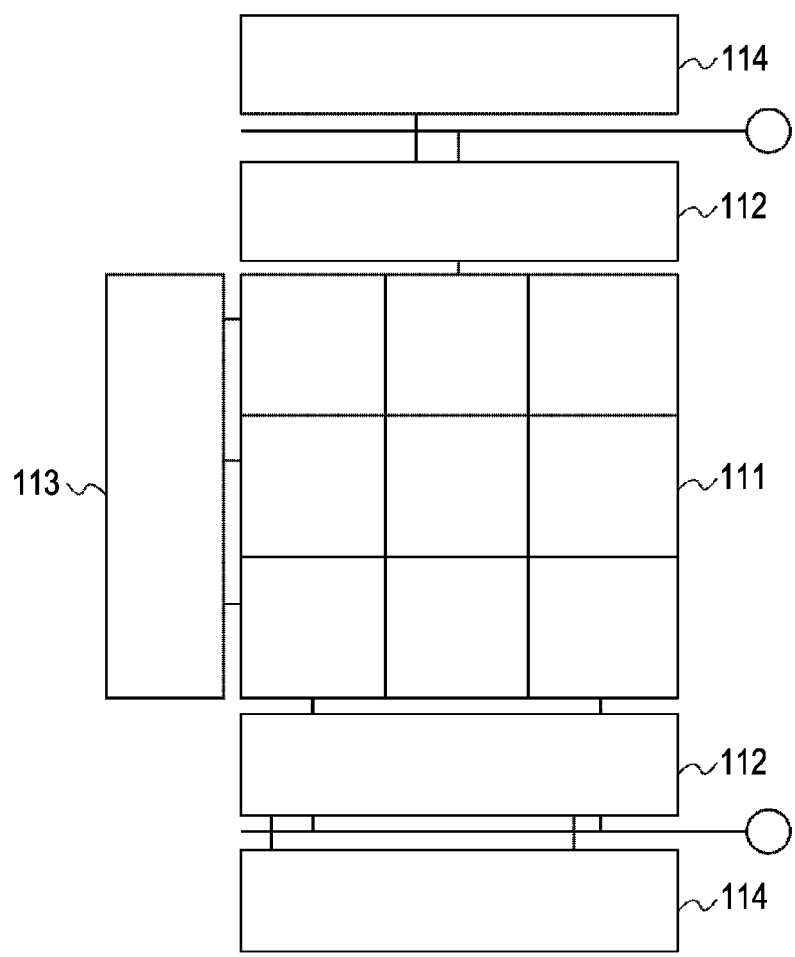
FIG. 1 is a schematic plan view of a photoelectric conversion device according to the present invention.

FIG. 1 is a layout plan view of a photoelectric conversion device. Reference numeral 111 represents the photoelectric conversion region. When the unit of a signal read from one photoelectric conversion element is defined as a pixel, a region in which the photoelectric conversion elements are arranged may also be referred to as a "pixel region". The pixel is the minimum unit of one photoelectric conversion element and a group of elements configured to read a signal from the photoelectric conversion element and then send the signal to an output line. The group of elements includes a transfer element such as a transfer MOS transistor, an amplifying element such as an amplifying MOS transistor, and a reset element such as a reset MOS transistor, described below. The elements may be shared between adjacent photoelectric conversion elements. Also in this case, the pixel is defined as the minimum unit of a group of elements configured to read a signal from the photoelectric conversion element.

A signal-processing circuit 112 amplifies a signal read from the photoelectric conversion region. Alternatively, the signal-processing circuit 112 is not limited to the amplifying circuit but may be a circuit that removes pixel noise by correlated double sampling (CDS). In addition, the signal-processing circuit 112 may be a circuit that simply converts signals read in parallel from a plurality of columns into serial signals. A vertical shift register 113 drives the MOS transistor located in the photoelectric conversion region. A horizontal shift resister 114 drives a MOS transistor of the signal-processing circuit. The signal-processing circuit 112 to the horizontal shift resister 114 may be included in the peripheral circuit region. When analog-to-digital (A/D) conversion is performed in the photoelectric conversion device, an A/D converter may be included in the peripheral circuit region.

Figure 9:
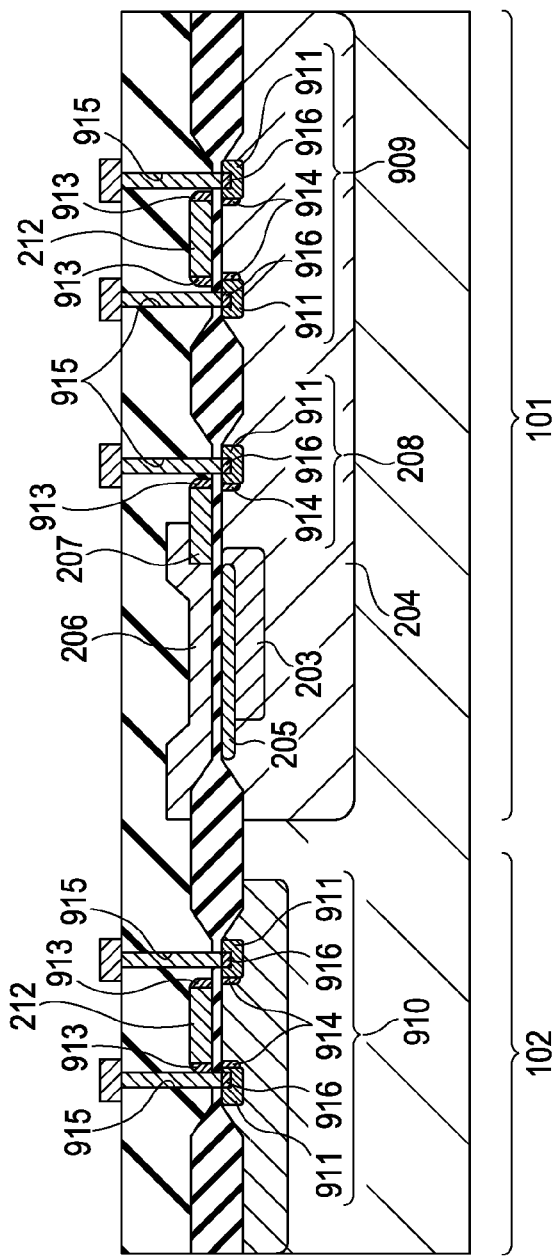
FIG. 9 is a schematic cross-sectional view of a photoelectric conversion device for explaining the present invention.

To understand the present invention, the mechanism of the present invention will be described in detail below. FIG. 9 is a schematic cross-sectional view of a photoelectric conversion device including a photoelectric conversion region 101 and a peripheral circuit region 102.

A MOS transistor 909 reads a signal fed from a photoelectric conversion element. A MOS transistor 910 is located in the peripheral circuit region. The source and the drain of each of the MOS transistor 909 located in the photoelectric conversion region and the MOS transistor 910 located in the peripheral circuit region have the same LDD structure. That is, the LDD structure has a heavily doped semiconductor region 911, a lightly doped semiconductor region 914 located under a side spacer 913, and a heavily doped semiconductor region 916 located under a contact hole 915.

An excessively low impurity concentration in the electric-field-relaxation layer or an excessively large width of the electric-field-relaxation layer of the LDD structure increases the parasitic resistance (series resistance) of the transistor, thus significantly degrading the driving ability and static characteristics. Thus, in the peripheral circuit for which the driving ability and static characteristics are important, the electric-field-relaxation layer having a relatively small width needs to be formed.

In the photoelectric conversion region that needs to relax the electric field for the purpose of miniaturization, the electric-field-relaxation layer having a larger width can be formed. However, according to the structure shown in FIG. 9, the drains in the photoelectric conversion region and the peripheral circuit region have the same structure. Thus, only either one property or the other can be satisfied.

In the present invention, both properties can be satisfied because the structure of a drain in a photoelectric conversion region is different from that of a drain in a peripheral circuit region. A lightly doped region of the drain in the photoelectric conversion region is located so as to have an area larger than the area of a lightly doped region of the drain in the peripheral circuit region.

A portion extending from a gate end to a region (first region) where the drain is in direct contact with a conductor has the actual effect of relaxing an electric field applied to the MOS transistor. Thus, by reducing an impurity concentration in a region between the first region and the gate end in the photoelectric conversion region compared with that in the peripheral circuit region, a large effect of relaxing an electric field can be obtained. The same effect is also obtained by reducing an impurity concentration in the drain of a MOS transistor located in the photoelectric conversion region compared with an impurity concentration in the drain of a MOS transistor located in the peripheral circuit region.

Specifically, the drain of the MOS transistor (first MOS transistor) located in the photoelectric conversion region has a first region that is in direct contact with a conductor and a second region that is closer to a channel of the MOS transistor than the first region. Also in a MOS transistor (second MOS transistor) located in the peripheral circuit region 102, the drain is electrically connected to a plug, which is a conductor. The drain includes a first region that is in direct contact with the plug and a second region that is closer to a channel than the first region. The second region includes a first subregion adjacent to the channel and a second subregion located between the first region and the first subregion. An impurity concentration in the second region is lower than an impurity concentration in the second subregion.

Figure 2A:
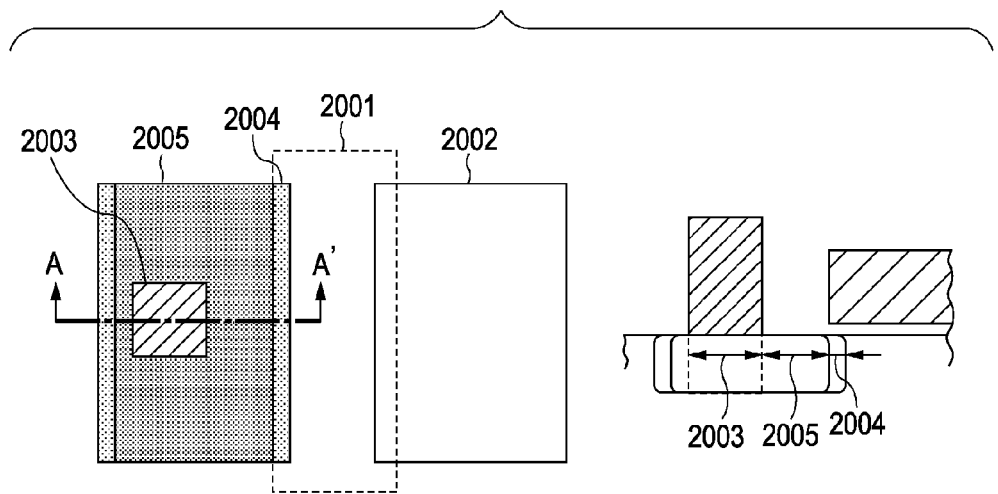
FIGS. 2A and 2B are plan views and cross-sectional views of a MOS transistor according to the present invention.
Figure 2B:
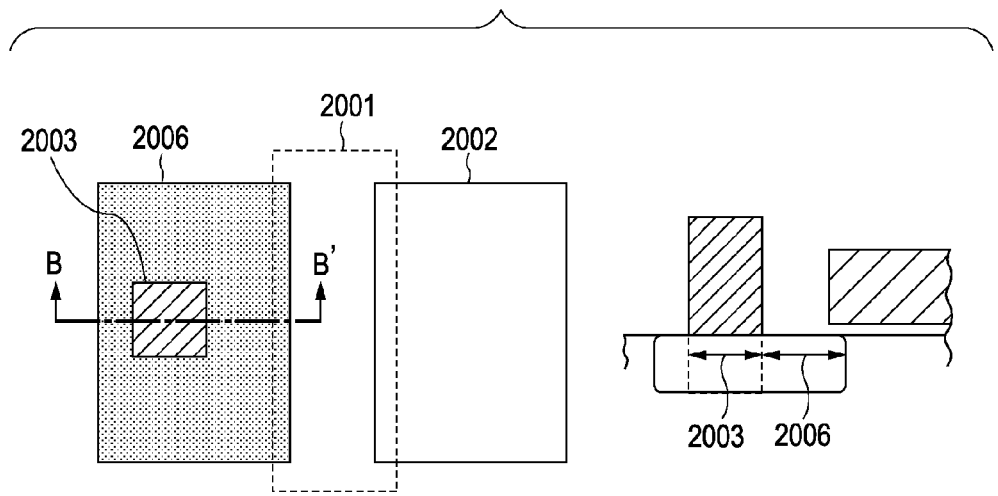

A further description will be provided with reference to FIGS. 2A and 2B. FIG. 2A shows a plan view and a cross-sectional view taken along line A-A' of a MOS transistor located in the peripheral circuit region. FIG. 2B shows a plan view and a cross-sectional view taken along line B-B' of a MOS transistor located in the photoelectric conversion region. Gate electrodes 2001, sources 2002, and connecting regions (first region) 2003 for connection with conductors are shown. A lightly doped semiconductor region (first subregion) 2004 is located adjacent to a gate. A region (second subregion) 2005 is located between the first region and the first subregion and has an impurity concentration higher than the first subregion. A lightly doped semiconductor region (second region) 2006 is located between the channel and the first region and has a low impurity concentration. An impurity concentration in the second region is lower than an impurity concentration in the second subregion.

This structure can reduce hot carriers generated in the MOS transistor located in the photoelectric conversion region. In addition, in the peripheral circuit region, the electric-field-relaxation layer having a relatively small width can be formed in the MOS transistor for which the driving ability and circuit characteristics are important. Furthermore, in the photoelectric conversion region, the absence of a step of forming a side wall can reduce noise caused by etching in the step.

Figure 3:
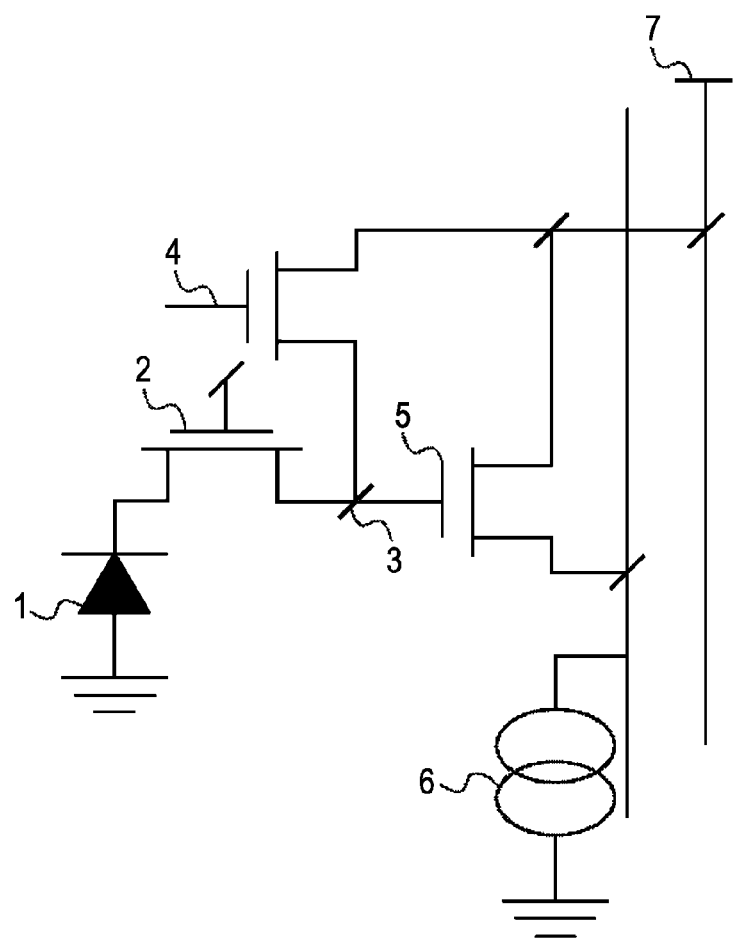
FIG. 3 is a circuit diagram of a photoelectric conversion device according to the present invention.

FIG. 3 is an exemplary equivalent circuit diagram of a pixel of a photoelectric conversion device according to the present invention. The photoelectric conversion region includes a photoelectric conversion element 1, a transfer MOS transistor 2, a reset MOS transistor 4, and an amplifying MOS transistor 5. The pixel is selected by a voltage applied to the drain of the reset MOS transistor. For example, the photoelectric conversion element is a photodiode that converts incident light into a charge by photoelectric conversion. The transfer MOS transistor functions as a transfer element that transfers the charge from the photoelectric conversion element to an input portion of the amplifying element. The amplifying MOS transistor transmits a change in electric potential in response to the charge generated in the photoelectric conversion element to a signal line. A target object with an electric potential to be changed may be a node in a floating state during transfer of the charge from the photoelectric conversion element. In this case, a floating diffusion region (FD) is used. The floating diffusion region is connected to the gate of the amplifying MOS transistor. The amplifying MOS transistor transmits a signal in response to the change in electric potential in the floating diffusion region to the signal line. In this case, the charge is amplified by source-follower operation and is then transmitted. Thus, the MOS transistor 5 is defined as an amplifying element. A power supply 7, the amplifying MOS transistor 5, the signal line, and a constant current source 6 constitute a source-follower circuit. In this example, the selective operation is performed on the basis of a drain voltage of the reset MOS transistor. Alternatively, a selective MOS transistor may be provided in order to perform selection.

Embodiments of the present invention will be described in detail below with reference to the drawings. The present invention is not limited to the disclosed exemplary embodiments. Combinations and changes may be made without departing from the scope of the invention. In each embodiment, only a specific MOS transistor will be exemplified. However, a structure in each embodiment may be applied to all MOS transistors located in each region.

First Embodiment

Figure 4:
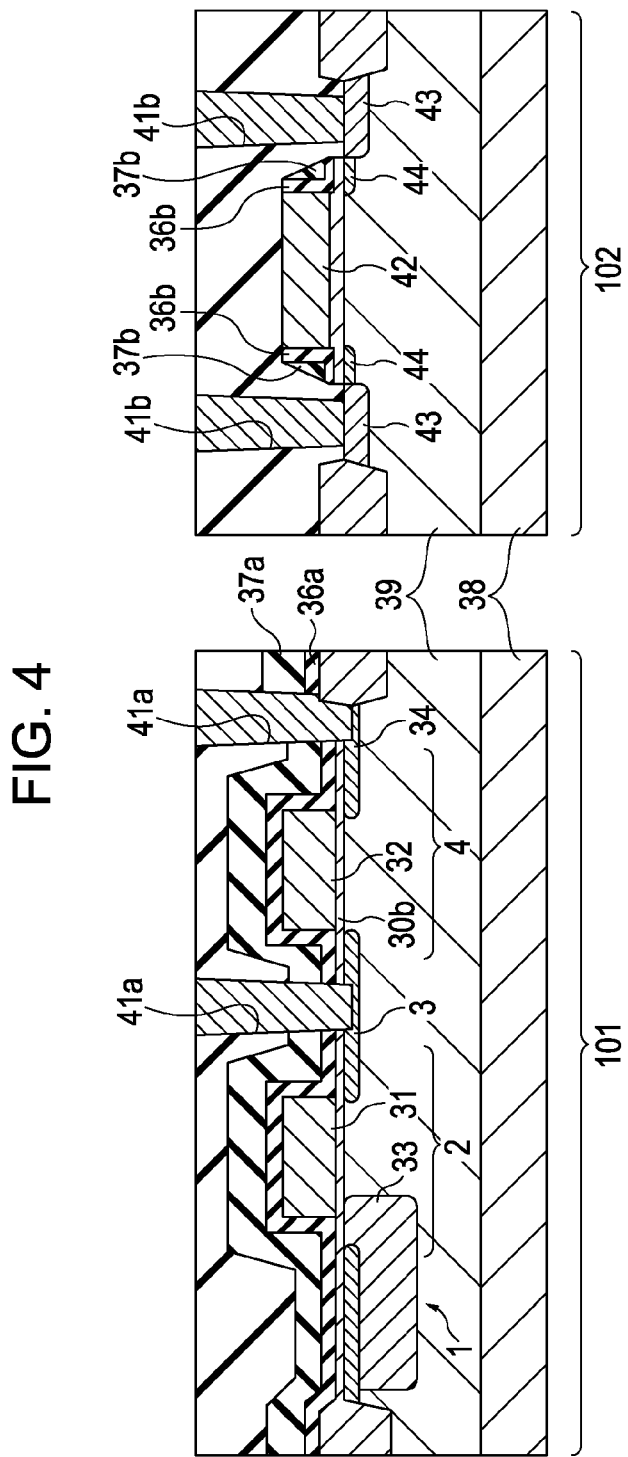
FIG. 4 is a schematic cross-sectional view of a photoelectric conversion device according to a first embodiment of the present invention.

FIG. 4 is a schematic cross-sectional view of a photoelectric conversion device according to this embodiment. In this embodiment, a reset MOS transistor is exemplified as a MOS transistor located in a photoelectric conversion region.

FIG. 4 shows a photoelectric conversion region 101 and a peripheral circuit region 102. In the photoelectric conversion region 101, a cross-sectional structure of a photoelectric conversion element, a transfer MOS transistor, and a reset MOS transistor is shown. A MOS transistor in the peripheral circuit region 102 constitutes any of the above-described circuits.

The photoelectric conversion region 101 shown in FIG. 4 includes a gate electrode 31 of the transfer MOS transistor and a gate electrode 32 of the reset MOS transistor. Reference numeral 33 represents a semiconductor region 33 of a first conductivity type, the semiconductor region constituting the photoelectric conversion element. The same conductivity type as a charge treated as a signal is used. When a charge is an electron, the semiconductor region is an n-type semiconductor region. A floating diffusion region 3 is formed of a semiconductor region of the first conductivity type. Reference numeral 34 represents a semiconductor region of the first conductivity type. A reference voltage for reset or pixel selection is applied to the semiconductor region 34. The semiconductor region 34 functions as the drain of the reset MOS transistor. A silicon nitride film 36a is covered with a silicon oxide film 37a. A combination of the silicon nitride film 36a and the silicon oxide film 37a can constitute an anti-reflection film that reduces the reflection of incident light from surfaces of the photoelectric conversion elements. The entire region is covered with an insulating film constituted by the silicon nitride film 36a and the silicon oxide film 37a, except for the bottoms of contact holes in the photoelectric conversion region 101. Contact holes 41a are filled with a conductor such as a contact plug. The insulating film is not limited to the combination of the silicon nitride film and the silicon oxide film.

The source of the transfer MOS transistor also serves as the semiconductor region 33 constituting the photoelectric conversion element. The drain of the transfer MOS transistor, the drain of the reset MOS transistor, and the floating diffusion region are formed of a common semiconductor region. The floating diffusion region 3 is connected to the gate electrode of the amplifying MOS transistor through an electrode (not shown). The semiconductor region 34 is connected to a reference voltage line for reset (not shown) through an electrode.

The peripheral circuit region 102 shown in FIG. 4 includes a gate electrode 42 of the MOS transistor and a heavily doped semiconductor region 43 of the first conductivity type, the heavily doped semiconductor region 43 serving as a source or a drain. Reference numeral 44 represents a lightly doped semiconductor region of the first conductivity type, the lightly doped semiconductor region 44 constituting the LDD structure and having an impurity concentration lower than that in the heavily doped semiconductor region 43. Side spacers are formed of silicon nitride films 36b and silicon oxide films 37b.

In the case where the silicon nitride film 36a and the silicon oxide film 37a in the photoelectric conversion region 101 have the same structure as the silicon nitride films 36b and the silicon oxide films 37b constituting the side spacers in the peripheral circuit region 102, the cost of manufacturing can be reduced.

In addition, the silicon nitride film 36a and the silicon oxide film 37a in the photoelectric conversion region may be used as masks when the heavily doped semiconductor region 43 in the peripheral circuit region 102 is formed by ion implantation. Thus, in the case where the silicon nitride film 36a and the silicon oxide film 37a also serve as photomasks for forming lightly doped semiconductor regions 3, 34, and 44, the cost of manufacturing can be reduced.

In the photoelectric conversion region 101, the source and the drain are each constituted by a lightly doped semiconductor region and each has a single-drain structure. The degradation of transistor properties caused by hot carriers can be effectively suppressed, compared with the LDD structure including the heavily doped semiconductor regions in the source and drain. In particular, this effect becomes pronounced as the MOS transistor is miniaturized. The degradation of transistor properties caused by hot carriers depends strongly on a gate length and a supply voltage. A smaller gate length and a higher supply voltage result in a significant degradation of transistor properties. The MOS transistor having the single drain structure in the photoelectric conversion region according to this embodiment can suppress the degradation of the properties even when the MOS transistor is a miniaturized MOS transistor having a small gate length.

In the lightly doped semiconductor regions 3 and 34 of the MOS transistors located in the photoelectric conversion region 101, portions that are in contact with the bottoms of the contact plugs need to have an impurity concentration capable of ensuring electrical connection with metal leads. Such a target impurity concentration can be achieved by impurity-ion implantation from openings of contact holes.

In the peripheral circuit region 102, since the MOS transistor has the heavily doped semiconductor regions and has the source and the drain each having the LDD structure, a high driving ability and resistance to hot carriers can be obtained. In particular, an operating speed in the peripheral circuit region needs to be higher than that in the photoelectric conversion region. Thus, it is important that the MOS transistor have the high driving ability. Therefore, it is important that the structure of the electric-field-relaxation region of the MOS transistor located in the photoelectric conversion region be different from that in the peripheral circuit region, as in the embodiment.

The silicon nitride film 36a in the photoelectric conversion region 101 may be used as an etch stop when a contact is opened by anisotropic dry etching. Thus, even when the contact is formed on an element isolation region due to misregistration, the contact is not in contact with the element isolation region or well 39 on a side face. Hence, a leakage current between the well 39 and the lightly doped semiconductor regions 3 and 34 can be suppressed, thereby reducing the distance between the contact and the element isolation region to miniaturize the element.

The silicon nitride films 36a and 36b may contain a large number of hydrogen molecules. In this case, after the formation of the films, the films are subjected to heat treatment at 350° C. or higher to diffuse hydrogen into a semiconductor substrate, thereby terminating dangling bonds. The silicon nitride film may be formed by plasma-enhanced chemical vapor deposition (CVD).

In this embodiment, a region including the anti-reflection film and the oxide film covering the anti-reflection film may be partially left in the peripheral circuit region. Furthermore, a side spacer formed of the anti-reflection film and the oxide film covering the anti-reflection film is formed. Then a MOS transistor having a source and a drain each constituted by a heavily doped semiconductor region and each having the LDD structure may be formed at part of the photoelectric conversion region.

Second Embodiment

In this embodiment, a method for producing a photoelectric conversion device will be described. FIGS. 5A to 5E illustrate a procedure for fabricating a photoelectric conversion device.

Figure 5A:
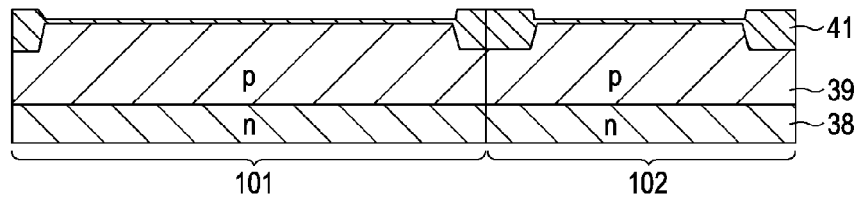
FIGS. 5A to 5E illustrate a procedure for fabricating a photoelectric conversion device according to a second embodiment.

As shown in FIG. 5A, a well (not shown) of a first conductivity type (n-type) and the well 39 of a second conductivity type (p-type) are formed in a semiconductor substrate 38 composed of silicon or the like. An element isolation region 41 is formed by shallow trench isolation (STI), selective oxidation, or the like. For convenience of description, in FIGS. 5A to 5E, the photoelectric conversion region 101 is shown adjacent to the peripheral circuit region 102.

Figure 5B:
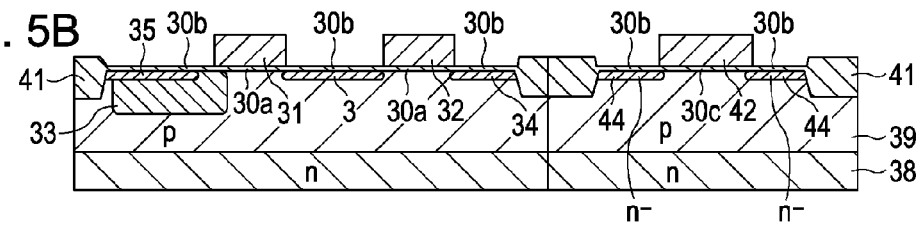

As shown in FIG. 5B, after the formation of the polysilicon gate electrodes 31, 32, and 42 of MOS transistors, the semiconductor region 33 of a photodiode constituting a photoelectric conversion element is formed by introduction of an n-type impurity. Then a p-type surface region 35 is formed by introduction of a p-type impurity in such a manner that the photodiode has a buried structure.

An n-type impurity is introduced by ion implantation with the gate electrodes as masks. Thereby, the lightly doped semiconductor regions 3, 34, and 44 partially constituting sources and/or drains located on a surface adjacent to the gate electrode are formed in a self-aligned manner.

Figure 5C:
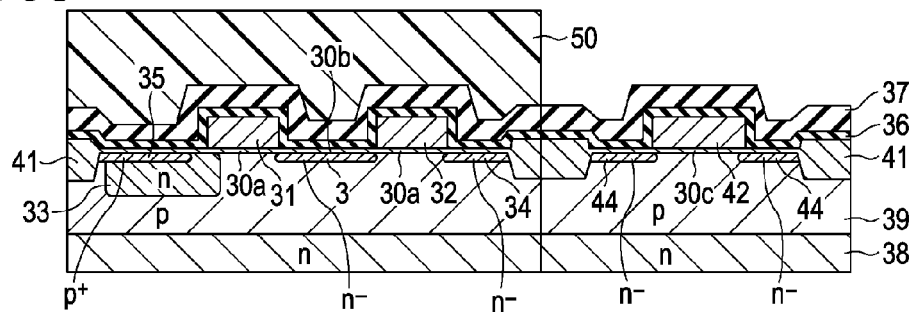

A thin silicon oxide film 30b is formed on a surface of the semiconductor substrate except element isolation regions and the gate electrodes. The thin silicon oxide film 30b may be formed by leaving a gate oxide film on the surface of the semiconductor substrate when the polysilicon gate electrodes are formed by anisotropic dry etching. Alternatively, the thin silicon oxide film 30b may be formed by thermal oxidation or deposition before a silicon nitride film 36 is deposited. As shown in FIG. 5C, the silicon nitride film 36 is formed, and then a silicon oxide film 37 is formed thereon. The silicon nitride film 36 and the silicon oxide film 37 (insulation films) are formed so as to cover the photoelectric conversion region 101 and the peripheral circuit region 102, thereby protecting the photoelectric conversion region.

Figure 5D:
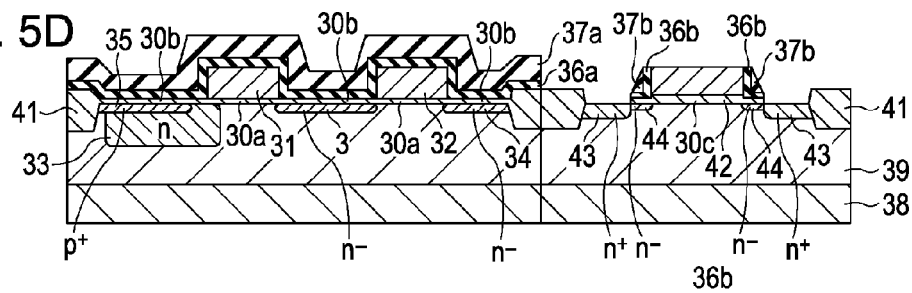

A resist 50 is formed on the photoelectric conversion region. The silicon nitride film 36 and the silicon oxide film 37 are subjected to etch back. Thereby, as shown in FIG. 5D, side spacers constituted by the silicon nitride films 36b and the silicon oxide films 37b are formed on side walls of the gate electrode 42 in the peripheral circuit region 102. Then an n-type impurity is introduced by ion implantation with the gate electrode and the side spacers as a mask in the peripheral circuit region 102. Thereby, the heavily doped semiconductor regions 43 each constituting a self-aligned source or drain are formed adjacent to the side spacers. In the photoelectric conversion region 101, the silicon nitride film 36 and the silicon oxide film 37 remaining on the entire surface serve as a mask during ion implantation. In this case, the cost of manufacturing can be reduced. Thereby, the structure shown in FIG. 5D is made.

Figure 5E:
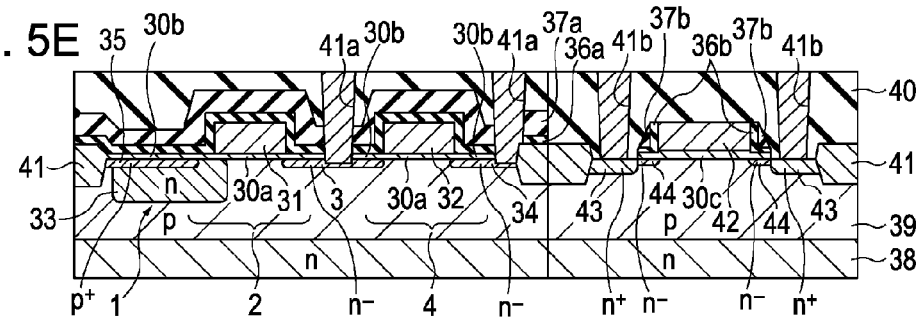

As shown in FIG. 5E, an insulating film 40 composed of borophosphosilicate glass (BPSG) and functioning as an interlayer insulating film is formed so as to cover the entirety of the peripheral circuit region. Contact holes 41a and 41b are formed by anisotropic dry etching with the silicon nitride film 36a as an etch stop in the photoelectric conversion region. In this way, the contact holes in the photoelectric conversion region 101 are formed in such a manner that bottoms of the contact holes are in contact with the semiconductor substrate in a self-aligned manner. Then the contact holes 41a and 41b are filled with a conductor to form electrodes. Thereby, the structure shown in FIG. 5E is made.

In any of the steps after the formation of the silicon oxide film, heat treatment can be performed at 350° C. or higher.

The embodiments including n-type MOS transistors have been described above. In the case where a photoelectric conversion device is produced by a CMOS process, p-type MOS transistors may be similarly formed if the conductivity type is changed.

In this embodiment, the sources and the drains of the MOS transistors located in the photoelectric conversion region each have the single-drain structure including the lightly doped semiconductor region. The MOS transistor located in the peripheral circuit region has the LDD structure. The lightly doped semiconductor region located in the photoelectric conversion region may be simultaneously formed in the step of forming the lightly doped region of the MOS transistor having the LDD structure in the peripheral circuit region.

The photoelectric conversion device produced by the process can suppress the degradation of properties of the MOS transistor located in the photoelectric conversion region caused by hot carriers and can achieve the high driving ability of the MOS transistor located in the peripheral circuit region.

Each of the contact holes is in contact with only the surface of the semiconductor substrate when the anti-reflection film is used as an etch stop. Thus, the leakage current between the well and the source and drain of the MOS transistor can be suppressed.

The insulating film is used as the etch stop for the anti-reflection film and the contact holes in the photoelectric conversion region and is used as the side-wall spacers of the MOS transistor in the peripheral circuit region. In this case, the cost of manufacturing can be reduced.

In addition, when the insulating film is formed of a silicon nitride film containing a large number of hydrogen molecules, the number of traps at the transistor interface and the interface between silicon and the silicon oxide film on the photodiode can be more effectively reduced.

Third Embodiment

In this embodiment, the structure of an amplifying MOS transistor will be described as a MOS transistor located in the photoelectric conversion region. This structure may be combined with the structure of the reset MOS transistor described in each of the first and second embodiments.

Figure 6:
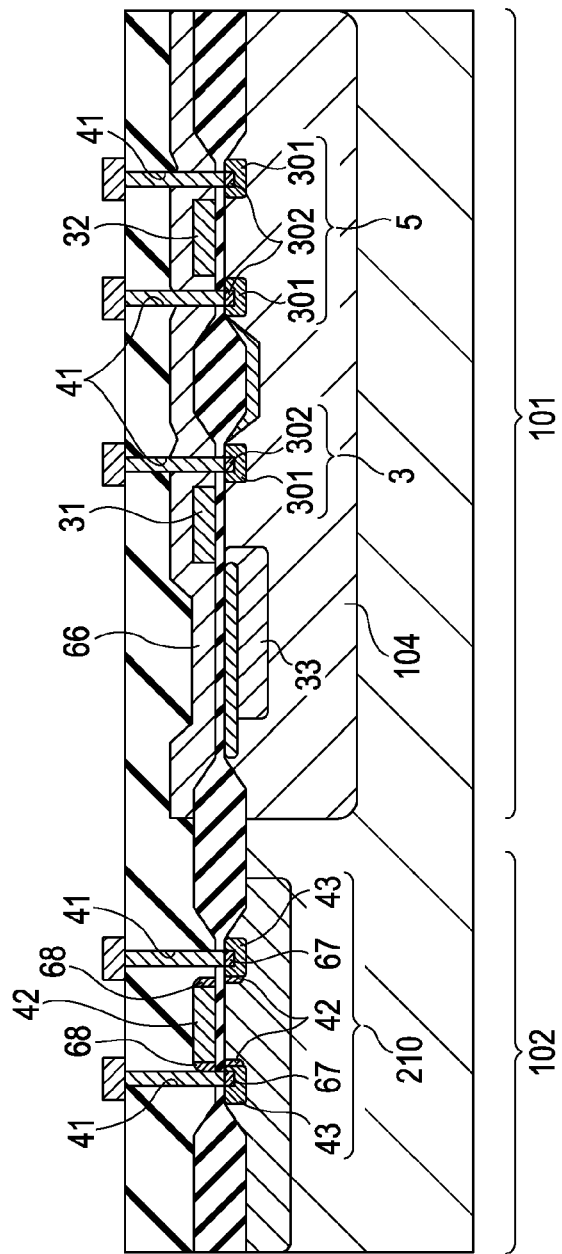
FIG. 6 is a schematic cross-sectional view of a photoelectric conversion device according to a third embodiment.

FIG. 6 shows a cross-sectional structure in a photoelectric conversion region and a peripheral circuit region of a photoelectric conversion device. Elements equivalent to those in the first and second embodiments are designated using the same reference numerals, and redundant description is not repeated.

An optical anti-reflection film 66 is disposed on a photoelectric conversion element and reduces the interfacial reflection on the surface of a photodiode. The anti-reflection film 66 may have a stacked structure including a silicon nitride layer and a silicon oxide layer.

The floating diffusion region 3 that receives a charge from the photoelectric conversion element includes a lightly doped semiconductor region 301 and a heavily doped semiconductor region 302 for connection to a conductor.

As shown in this embodiment, the floating diffusion region 3 and the source and drain of the MOS transistor 5 are each constituted by the lightly doped semiconductor region 301 of a first conductivity type and the heavily doped semiconductor region 302 of the first conductivity type, the heavily doped semiconductor region 302 being in direct contact with the conductor.

Side spacers 68 in the peripheral circuit region are each formed of the same film as the anti-reflection film 66. Lightly doped semiconductor regions of the first conductivity type are formed in a self-aligned manner with a gate electrode and are also located under the side spacers 68. The heavily doped semiconductor regions 43 of the first conductivity type are formed in a self-aligned manner with the side spacers 68 and thus are not formed under the side spacers 68 or the anti-reflection film 66.

The anti-reflection film 66 is not subjected to etching in the photoelectric conversion region, thus reducing noise caused by damage from etching. Furthermore, after the formation of the anti-reflection film 66, no step of exposing the semiconductor surface is performed, thus preventing contamination with a metal element or the like. As a result, the rate of occurrence of a point defect in dark conditions can be reduced.

The electric-field-relaxation layer will be described in more detail below. An excessively low impurity concentration in the electric-field-relaxation layer or an excessively large width of the electric-field-relaxation layer of the LDD structure increases the parasitic resistance (series resistance) of the transistor, thus significantly degrading the driving ability and static characteristics. In particular, in the peripheral circuit for which the driving ability and static characteristics are important, the electric-field-relaxation layer having a relatively small width needs to be formed. On the other hand, in the photoelectric conversion region that needs to relax an electric field for the purpose of miniaturization, the electric-field-relaxation layer having a larger width can be formed. A portion extending from a gate end to a corresponding one of the heavily doped semiconductor regions of the first conductivity type contributes significantly to the electric-field relaxation in the MOS transistor. Thus, the MOS transistor located in the photoelectric conversion region can have an impurity concentration lower than that of the MOS transistor located in the peripheral circuit region and can have the lower-impurity-concentration region having a large width.

Each of the heavily doped semiconductor regions 302, which are in direct contact with the conductors of the first conductivity type, can be formed in a self-aligned manner by ion implantation through the corresponding contact hole after the formation of the contact hole. This allows a small transistor to be designed and results in a satisfactory ohmic contact. In addition to the above-described effects, the structure shown in this embodiment has the effect of reducing pixel defects and random noise caused by a leakage current flowing through the floating diffusion region 3.

As shown in FIG. 6, the floating diffusion region 3 is formed of the lightly doped electric-field-relaxation region (lightly doped semiconductor region 301 of the first conductivity type) and thus has a significant effect of relaxing an electric field at a region other than the gate end. That is, the floating diffusion region 3 can relax an electric field applied to a junction with a semiconductor region 104 of a second conductivity type and a junction with a channel stop region under a separating portion, thereby reducing the leakage current flowing through the floating diffusion region 3 and random noise during readout. The occurrence of a pixel causing the sudden occurrence of a large leakage current flowing through the floating diffusion region 3 correlates with an electric field applied to the floating diffusion region 3. Therefore, point defects can also be reduced according to this embodiment.

In this embodiment, the MOS transistor located in the peripheral circuit region having the same conductivity type as the MOS transistor located in the photoelectric conversion region has been described. Alternatively, CMOS transistor may be used in the peripheral circuit region. Also a MOS transistor having a conductivity type opposite the conductivity type of the MOS transistor located in the photoelectric conversion region may have the same structure.

The structure according to this embodiment has profound effects on an n-type MOS transistor which easily generates hot carriers. When an n-type MOS transistor is located in the photoelectric conversion region, and when the n-type MOS transistor located in the photoelectric conversion region and the n-type MOS transistor located in the peripheral circuit region each have the structure according to this embodiment, particularly significant effects can be obtained.

On the other hand, when a p-type MOS transistor is located in the photoelectric conversion region, the structure according to this embodiment is effective from the viewpoint of the processability of such a minute pixel. In this embodiment, the anti-reflection film 66 is used. In a sensor having the structure according to this embodiment, also in the case where a single oxide film that does not have antireflective properties is used in place of the anti-reflection film, the effects, such as electric-field relaxation and the reduction of point defects, of this embodiment can be exerted.

Fourth Embodiment

Figure 7:
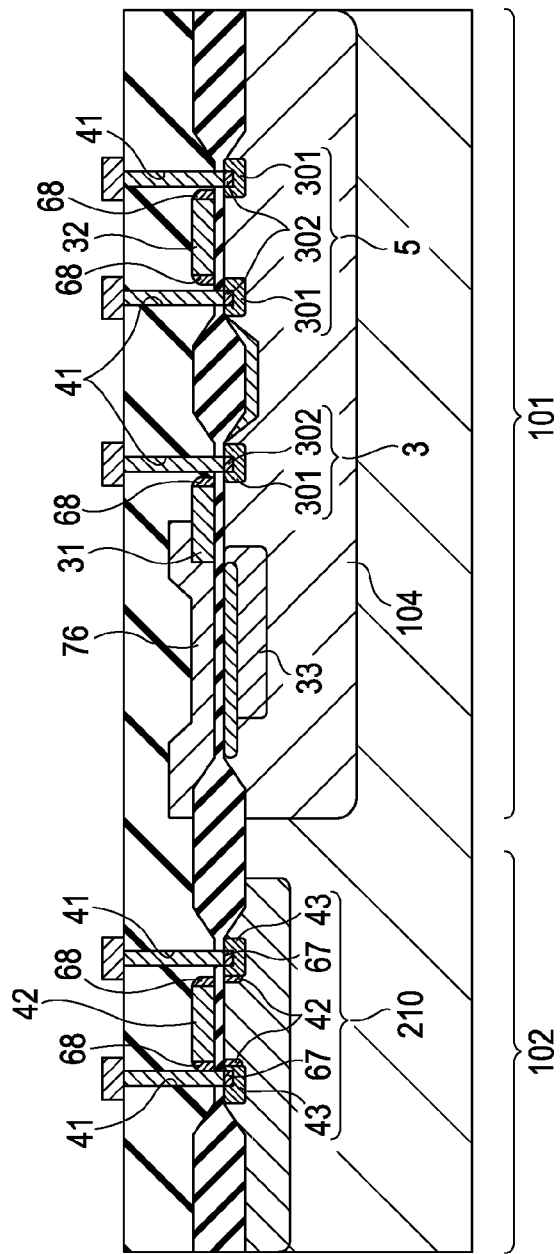
FIG. 7 is a schematic cross-sectional view of a photoelectric conversion device according to a fourth embodiment.

FIG. 7 shows a cross-sectional structure of a photoelectric conversion device according to this embodiment. Elements equivalent to those in the first to third embodiments are designated using the same reference numerals, and redundant description is not repeated.

In this embodiment, although an anti-reflection film is subjected to etching in the photoelectric conversion region, the heavily doped semiconductor region 43 of a first conductivity type is not located in the photoelectric conversion region. A mask pattern for forming the heavily doped semiconductor region 43 of the first conductivity type is formed in such a manner that the photoelectric conversion region is covered with a resist. The use of the mask pattern produces the structure shown in FIG. 7.

In this embodiment, a lightly doped electric-field-relaxation layer (lightly doped semiconductor region 301 of a first conductivity type) having a lower impurity concentration or having a larger width can be designed, thereby improving the effect of relaxing an electric field. This can suppress the generation of hot carriers, thus improving reliability and withstanding voltage. In a peripheral circuit region, the electric-field-relaxation layer having a relatively small width can be formed.

Fifth Embodiment

In this embodiment, a region of a drain which is in direct contact with a conductor will be described. In general, conductors such as contact plugs that electrically connect leads with sources and drains of MOS transistors need to have low resistance and ohmic characteristics. In photoelectric conversion devices sensitive to point defects caused by metal contaminants, a process of forming a silicide or a self-aligned silicide (salicide) is intentionally not applied, in some cases. Thus, methods for forming ohmic contact between drains and conductors are important for photoelectric conversion devices in particular.

In the case where the drain of the MOS transistor located in the photoelectric conversion region has the electric-field-relaxation structure as described in the foregoing embodiments, a method for forming low-resistance ohmic contact is required. A structure providing the low-resistance ohmic contact and the method will be described below.

Figure 8:
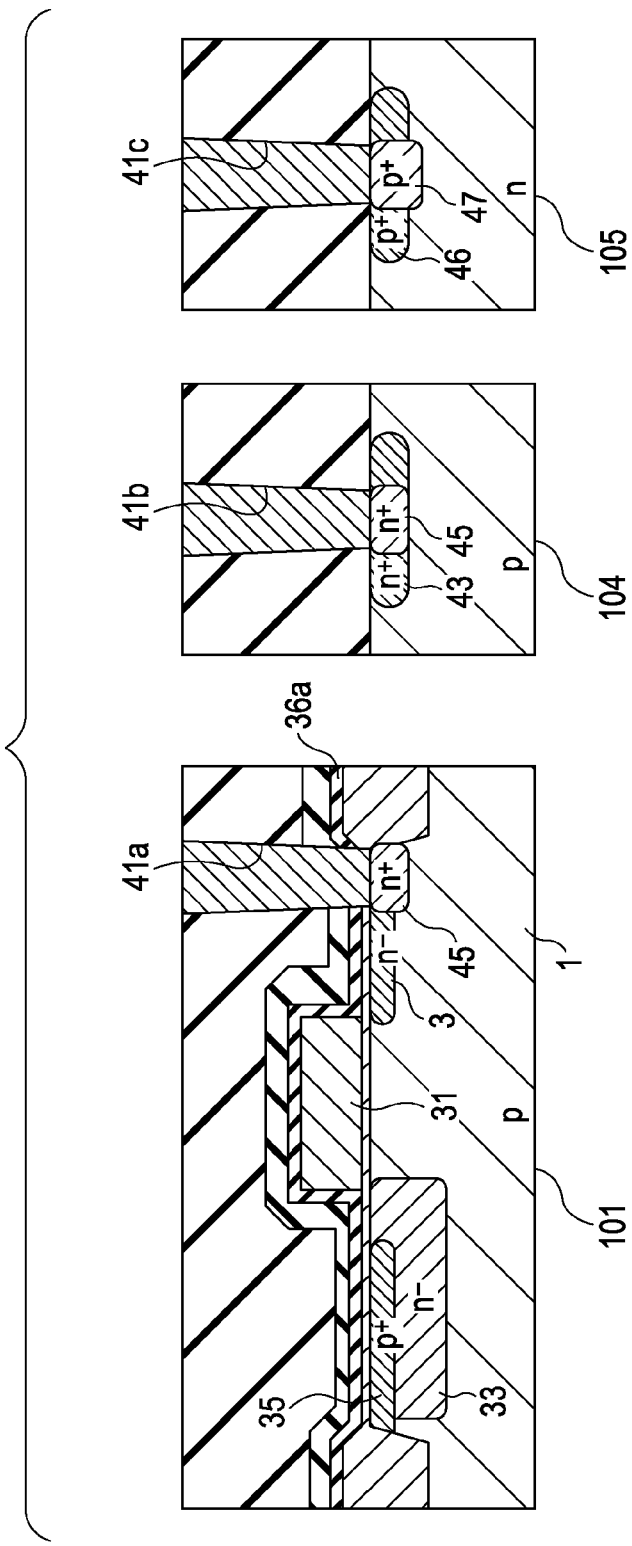
FIG. 8 is a schematic cross-sectional view of a photoelectric conversion device according to a fifth embodiment.

FIG. 8 shows a cross-sectional view of a photoelectric conversion device according to this embodiment. Elements equivalent to those in the first to fourth embodiments are designated using the same reference numerals, and redundant description is not repeated. Reference numeral 101 represents a portion where a MOS transistor (n-type) located in a photoelectric conversion region is connected to a conductor. Reference numeral 104 represents a portion where the source or drain of an n-type MOS transistor located in a peripheral circuit region is connected to a conductor. Reference numeral 105 represents a portion where the source or drain of a p-type MOS transistor located in the peripheral circuit region is connected to a conductor.

As shown in the portion 101, the floating diffusion region 3 includes an n-type heavily doped semiconductor region 45 that is in direct contact with the conductor. Also in the portion 104, the source or drain includes an n-type heavily doped semiconductor region 45. In the portion 105, the source or drain includes a p-type heavily doped semiconductor region 46. By applying the structure according to this embodiment, all contact plugs have a low resistance and satisfactory ohmic contact properties.

A method for producing the photoelectric conversion device according to this embodiment will be described below.

The photoelectric conversion device is formed by the same procedure as in the second embodiment until the structure shown in FIG. 5D is formed. An impurity concentration d1 in the lightly doped semiconductor region may be set in the range of about $1E17/cm^3$ to $5E18/cm^3$. Then contact holes each corresponding to the source or the drain to be connected to a conductor are formed by anisotropic dry etching. Next, an n-type impurity, such as $PH_3$, is introduced using a photomask into the bottom of the contact hole communicating with the floating diffusion region 3 located in the photoelectric conversion region and the bottom of the hole communicating with the semiconductor region 43 located in the peripheral circuit region 104. To obtain low-resistance ohmic contact for the semiconductor region 3 in the photoelectric conversion region, the dose can be set in such a manner that an impurity concentration d2 in the region in direct contact with the conductor is in the range of $5E18/cm^3$ to $5E19/cm^3$. In view of cost reduction, the n-type impurity may be introduced into the entire surface without the photomask.

Then a p-type impurity such as B is introduced using a photomask into the bottom of the contact hole communicating with the p-type heavily doped semiconductor region in the peripheral circuit region 105, thereby forming a heavily doped semiconductor region. Alternatively, the p-type semiconductor region may be formed by ion implantation with the above-described n-type impurity. In this case, conditions for implanting the p-type impurity ions need to be set in such a manner that the resulting semiconductor region covers the entirety of the n-type heavily doped semiconductor region located in the peripheral circuit region 104. For example, the dose can also be set in such a manner that an impurity concentration d3 in the region in direct contact with the conductor is in the range of 5E18/cm³ to 5E19/cm³.

The procedure according to this embodiment may be applied to the first to fourth embodiments. In addition, the procedure may be applied to various MOS transistors located in the photoelectric conversion region.

Image Pickup System

Figure 10:
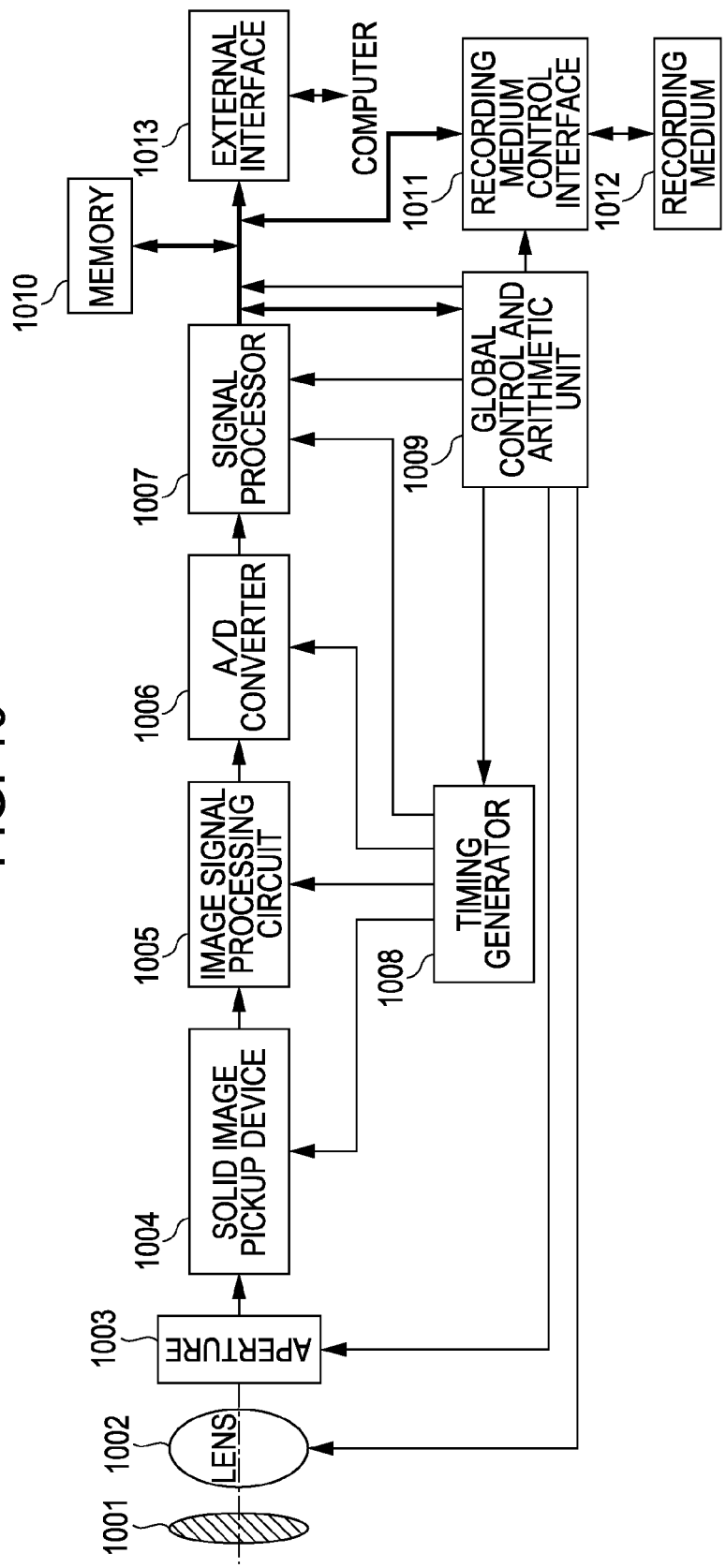
FIG. 10 is a block diagram illustrating an image pickup system including a photoelectric conversion device.

FIG. 10 shows an exemplary block diagram when a photoelectric conversion device of the present invention is applied to a camera. A shutter 1001 is disposed before an imaging lens 1002 and controls exposure. An aperture 1003 controls the amount of light according to need, and then light is focused on a photoelectric conversion device 1004. A signal supplied from the photoelectric conversion device 1004 is processed by a signal-processing circuit 1005. An A/D converter 1006 converts the resulting analog signal to a digital signal. The output digital signal is subjected to arithmetic processing by a signal processor 1007. The processed digital signal is stored in a memory 1010 or is transmitted to an external apparatus through an external interface 1013. The photoelectric conversion device 1004, the image signal-processing circuit 1005, the A/D converter 1006, and the signal processor 1007 are controlled by a timing generator. The entire system is controlled by a global control and arithmetic unit 1009. To record an image on a recording medium 1012, the output digital signal is recorded through a recording-medium control interface 1011 that is controlled by the global control and arithmetic unit.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-210531 filed Aug. 2, 2006, which is hereby incorporated by reference herein in its entirety.

What is claimed is:

1. A method for manufacturing a photoelectric conversion device that includes a pixel region in which a plurality of pixels are arranged in a matrix, each of the pixels having a photoelectric conversion element, a first transistor for outputting a signal generated in the photoelectric conversion element to a signal line, and a peripheral circuit region, arranged outside of the pixel region, having second transistors for a scanning circuit configured to supply a drive pulse to the first transistor, the pixel region being located on a semiconductor substrate and the peripheral circuit region being located on the semiconductor substrate, the method comprising steps of:
forming gate electrodes of the first transistors and the second transistors;
implanting impurity ions of a first conductivity type using the gate electrodes as masks;
forming a first insulating film that covers the peripheral circuit region and an entirety of the pixel region;
removing portions of the first insulating film formed on the peripheral circuit region while protecting the pixel region by the first insulating film formed on the entirety of the pixel region, such that side spacers of the second transistors are formed and side spacers of the first transistors are not formed;
implanting impurity ions of the first conductivity type using the side spacers as masks;
forming a second insulating film that covers the pixel region and the peripheral circuit region;
forming contact holes, by an etching process, in regions of the second insulating film corresponding to drain regions of the first transistors; and
filling the contact holes with a conductor,
wherein, in the forming contact holes, the first insulating film left in the pixel region after the forming the side spacers of the second transistors is used as an etch stop film in the pixel region, and
wherein, in the forming the side spacers of the second transistors, the first insulating film is not left on regions of sources and drains of the second transistors.

2. The method for manufacturing a photoelectric conversion device according to claim 1, wherein the first transistor comprises a transfer transistor configured to transfer electrical charges generated in the photoelectric conversion element to a floating diffusion, a reset transistor configured to supply a predetermined voltage to the floating diffusion, and an amplifying transistor configured to read a signal in response to an electric charge in the floating diffusion to the signal line.

3. The method for manufacturing a photoelectric conversion device according to claim 2, further comprising steps of:
forming contact holes in regions of the second insulating film corresponding to the floating diffusions; and
implanting impurity ions of the first conductivity type into the contact holes on the floating diffusions in a self-aligned manner.

4. The method for manufacturing a photoelectric conversion device according to claim 3, wherein the second insulating film is formed in a state that impurity concentrations of a source region and a drain region of the second transistors are higher than an impurity concentration of the floating diffusion.

5. The method for manufacturing a photoelectric conversion device according to claim 2, wherein in the step of forming contact holes, a silicon nitride film is used as the etch stop film.

6. The method for manufacturing a photoelectric conversion device according to claim 2, wherein the photoelectric conversion device further includes transistors disposed in a column circuit at a subsequent stage of the signal line, the column circuit being configured to process signals transmitted through the signal line.

7. The method for manufacturing a photoelectric conversion device according to claim 1, wherein the first insulating film includes a silicon nitride film and a silicon oxide film.

8. The method for manufacturing a photoelectric conversion device according to claim 7, wherein the etch stop film is a silicon nitride film.

9. A method for manufacturing a photoelectric conversion device that includes a pixel region in which a plurality of pixels are arranged in a matrix, each of the pixels having a photoelectric conversion element and a first transistor for outputting a signal generated in the photoelectric conversion element to a signal line, and a peripheral circuit region, arranged outside of the pixel region, having second transistors disposed in a column circuit at a subsequent stage of the signal line, the column circuit being configured to process signals transmitted through the signal line, the pixel region being located on a semiconductor substrate and the peripheral circuit region being located on the semiconductor substrate, the method comprising steps of:
forming gate electrodes of the first transistors and the second transistors;
implanting impurity ions of a first conductivity type using the gate electrodes as masks;

forming a first insulating film that covers the peripheral circuit region and an entirety of the pixel region;

removing portions of the first insulating film formed on the peripheral circuit region while protecting the pixel region by the first insulating film formed on the entirety of the pixel region, such that side spacers of the second transistors are formed and side spacers of the first transistors are not formed;

implanting impurity ions of the first conductivity type using the side spacers as masks;

forming a second insulating film that covers the pixel region and the peripheral circuit region;

forming contact holes, by an etching process, in regions of the second insulating film corresponding to drain regions of the first transistors; and filling the contact holes with a conductor, wherein, in the forming contact holes, the first insulating film left in the pixel region after the forming the side spacers of the second transistors is used as an etch stop film in the pixel region, and wherein, in the forming the side spacers of the second transistors, the first insulating film is not left on regions of sources and drains of the second transistors.

10. The method for manufacturing a photoelectric conversion device according to claim 9, wherein the first transistor comprises a transfer transistor configured to transfer electrical charges generated in the photoelectric conversion element to a floating diffusion, a reset transistor configured to supply a predetermined voltage to the floating diffusion, and an amplifying transistor configured to read a signal in response to an electric charge in the floating diffusion to the signal line.

11. The method for manufacturing a photoelectric conversion device according to claim 10, further comprising steps of:

forming contact holes in regions of the second insulating film corresponding to the floating diffusions; and implanting impurity ions of the first conductivity type into the contact holes on the floating diffusions in a self-aligned manner.

12. The method for manufacturing a photoelectric conversion device according to claim 11, wherein the second insulating film is formed in a state that impurity concentrations of a source region and a drain region of the second transistors are higher than an impurity concentration of the floating diffusion.

13. The method for manufacturing a photoelectric conversion device according to claim 10, wherein, in the step of forming contact holes, a silicon nitride film is used as the etch stop film.

14. The method for manufacturing a photoelectric conversion device according to claim 9, wherein the first insulating film includes a silicon nitride film and a silicon oxide film.

15. The method for manufacturing a photoelectric conversion device according to claim 14, wherein the etch stop film is a silicon nitride film.

* * * * *